United States Patent
Shibata

(10) Patent No.: US 7,253,499 B2
(45) Date of Patent: Aug. 7, 2007

(54) III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

(75) Inventor: Masatomo Shibata, Tsuchiura (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 296 days.

(21) Appl. No.: 10/953,354

(22) Filed: Sep. 30, 2004

(65) Prior Publication Data

US 2005/0274975 A1 Dec. 15, 2005

(30) Foreign Application Priority Data

Jun. 11, 2004 (JP) ............................. 2004-174615

(51) Int. Cl.
*H01L 29/20* (2006.01)
(52) U.S. Cl. ............... 257/615; 257/613; 257/E21.097; 438/478; 438/479
(58) Field of Classification Search .................... None
See application file for complete search history.

(56) References Cited

U.S. PATENT DOCUMENTS

| | | |
|---|---|---|
| 6,667,184 B2 | 12/2003 | Motoki et al. |
| 2001/0030329 A1* | 10/2001 | Ueta et al. ................... 257/103 |
| 2002/0197825 A1 | 12/2002 | Usui et al. |

FOREIGN PATENT DOCUMENTS

| | | |
|---|---|---|
| JP | 11-251253 | 9/1999 |
| JP | 2003-165799 | 6/2003 |
| JP | 2003-178984 | 6/2003 |

OTHER PUBLICATIONS

Madelung (Editor), Semiconductors—Basic Data, 1996, 2nd Revised Edition, Springer-Verlag, p. 86-90.*
Ok-Hyun Nam, et al., "Lateral epitaxy of low defect density GaN layers via organometallic vapor phase epitaxy", Appl. Phys. Lett., vol. 71, No. 18, Nov. 3, 1997, pp. 2638-2640.
Masaru Kuramoto, et al., Room-Temperature Continuous-Wave Operation of InGaN Multi-Quantum-Well Laser Diodes Grown on an n-GaN Substrate with a Backside n-Contact.
Tsvetanka s. Zheleva, et al., "Pendeo-Epitaxy-A New Approach for Lateral Growth of Gallium Nitride Structures", MRS Internet J. Nitride Semicond. Res. 4S1, G3.38 (1999).
Yuichi Oshima, et al., "Preparation of Freestanding GaN Wafers by Hydride Vapor Phase Epitaxy with Void-Assisted Separation", Japan Journal Appl. Phys., vol. 42, Part 2, No. 1A/B, Jan. 15, 2003, pp. L1-L3.
Kensaku Motoki, et al., "Preparation of Large Freestanding GaN Substrate by Hydride Vapor Phase Epitaxy Using GaAs as a Starting Substrate", Japan Journal Appl. Phys., vol. 40, Part 2, No. 2B, Feb. 15, 2001, pp. L140-L143.

* cited by examiner

*Primary Examiner*—Leonardo Andujar
*Assistant Examiner*—Kevin Quinto
(74) *Attorney, Agent, or Firm*—McGinn IP Law Group, PLLC

(57) ABSTRACT

A III-V group nitride system semiconductor self-standing substrate has III-V group nitride system semiconductor single crystal with a hexagonal crystal system crystalline structure. The substrate is provided with a polished surface at every position of which crystal orientation perpendicular to the substrate surface is inclined 0.09 degrees or more from the C-axis direction of the substrate.

15 Claims, 7 Drawing Sheets

30 GaN SELF-STANDING SUBSTRATE

45mm

30 GaN SELF-STANDING SUBSTRATE

INCLINATION DIRECTION OF C-AXIS

III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

The present application is based on Japanese patent application No. 2004-174615, the entire contents of which are incorporated herein by reference.

BACKGROUND OF THE INVENTION

1. Field of the Invention

The present invention relates to a III-V group nitride system semiconductor self-standing substrate, a method of making the same, and a III-V group nitride system semiconductor wafer.

2. Description of the Related Art

Nitride system semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be used for short-wavelength light emitting devices. Further, they have a high saturation drift velocity of electron and can use two-dimensional carrier gases in hetero junction. Therefore, they are also expected to be used for electronic devices.

With silicon (Si) or gallium arsenide (GaAs) which is already in popular use, an epitaxial growth layer of silicon (Si) or gallium arsenide (GaAs) to compose a device is homo-epitaxially grown on Si substrate or GaAs substrate of same kind of material. In the homo-epitaxial growth on homo-substrate, the crystal growth proceeds in step flow mode on the initial stage. Therefore, it is easy to obtain a flat and epitaxially grown surface while generating little crystal defect.

In the case that a ternary or more compound crystal layer such as AlGaInP is grown on GaAs substrate, the surface morphology of epitaxial layer is likely to be roughened. However, by intentionally inclining the plane orientation of underlying substrate from a low index surface as a reference surface to a specific direction, which is generally called "off-orientation", it becomes possible to obtain a flat epitaxially grown surface while generating little crystal defect. The direction or angle of off-orientation can have an optimum value according to the kind of material or growth conditions of an epi-layer grown thereon, and an optimum off-direction or off-angle common to all material substrates does not exist. For example, in case of GaAs substrate, it is inclined from its (001)-face as a reference surface to [110] direction or [1-10] direction, and its off-angle varies in the range of about 0 to 20 degrees.

On the other hand, it is difficult to grow a bulk crystal of nitride system semiconductor, and a GaN self-standing substrate did not exist before the epitaxial growth of nitride is researched. Therefore, nitride system semiconductor crystal has been hetero-epitaxially grown on underlying single-crystal sapphire as a hetero-substrate by using a vapor-phase growth process such as MOVPE (metal organic vapor phase epitaxy), MBE (molecular beam epitaxy) and HVPE (hydride vapor phase epitaxy). Even now, such a process is used for the manufacture of blue LED's.

However, in the hetero-epitaxial growth on hetero-substrate, a number of dislocations (defects) must be generated in grown crystal due to a lattice mismatch between the underlying substrate and the grown crystal. Therefore, if such process is applied to a device such as a laser diode sensitive to the crystal defect, the light output lowers and the lifetime of device is shortened.

In recent years, ELO (epitaxial lateral overgrowth; e.g., Appl. Phys. Lett. 71 (18) 2638 (1997)), FIELO (facet-initiated epitaxial lateral overgrowth; e.g., Jpan. J. Appl. Phys. 38, L184 (1999)) and pendeoepitaxy (e.g., MRS Internet J. Nitride Semicond. Res. 4S1, G3.38 (1999)) are reported as a growth method for reducing a defect density generated due to the lattice mismatch between sapphire and GaN. In these methods, a $SiO_2$ patterning mask etc. is formed on GaN grown on a sapphire substrate, and then GaN is selectively grown from the mask window. Thereby, the propagation of dislocation from underlying crystal can be suppressed. Due to such a growth method, the dislocation density in GaN can be significantly reduced to a level of $10^7$ $cm^{-2}$ or so.

Further, various methods of making a self-standing GaN substrate are suggested that a thick GaN layer with reduced dislocation density is epitaxially grown on a hetero-substrate such as sapphire and then the GaN layer grown is separated from the underlying substrate. For example, Japanese patent application laid-open No. 11-251253 discloses a method of making a self-standing GaN substrate that a GaN layer is grown on a sapphire substrate by ELO and then the sapphire substrate is removed by etching.

Other than this, VAS (Void-Assisted Separation: e.g., Y. Oshima et al., Jpn. J. Appl. Phys. Vol. 42 (2003) pp. L1-L3, Japanese patent application laid-open No. 2003-178984) and DEEP (Dislocation Elimination by the Epi-growth with inverted-Pyramidal pits: e.g., K. Motoki et al., Jpn. J. Appl. Phys. Vol. 40 (2001) pp. L140-L143, Japanese patent application laid-open No. 2003-165799) are known. The VAS is conducted such that GaN is grown through TiN thin film with a mesh structure on substrate such as sapphire while providing voids at the interface of underlying substrate and GaN layer, thereby allowing both the separation and the dislocation reduction of GaN substrate. The DEEP is conducted such that GaN is grown on a GaAs substrate, which is removable by etching, by using a SiN patterning mask while intentionally forming pits surrounded by facets on the surface of crystal, accumulating dislocations at the bottom of pits to allow regions other than pits to have a low dislocation density.

However, even when such a GaN self-standing substrate is used to grow a GaN system epitaxial layer thereon, it is difficult to flatten its surface morphology in the epitaxial growth while offering high flatness, uniformity and reproducibility.

To use an off-oriented GaN self-standing substrate may be thought in flattening the surface morphology of epi-layer of nitride system semiconductor grown thereon, as in the case of the other compound semiconductor substrate such as GaAs substrate.

However, even when using a hetero-substrate properly off-oriented, a GaN self-standing substrate obtained must be subjected to a dispersion in off-orientation due to a distortion (warping) of substrate generated during the crystal growth since it is made by separating a thick crystal grown hetero-epitaxially from the hetero-substrate, different from the case of a GaAs substrate that a wafer can be cut off from an ingot grown as a bulk crystal. Therefore, any GaN substrate with an in-plane uniform off-orientation cannot be obtained yet. When III-V group nitride system semiconductor crystal is epitaxially grown on such an off-oriented GaN substrate, due to the dispersion in off-orientation, the surface morphology of epitaxial growth layer will be roughened in the plane of substrate, and the composition of mixed crystal or the impurity concentration will be dispersed. These are unique problems on nitride system semiconductor self-standing substrates.

SUMMARY OF THE INVENTION

It is an object of the invention to provide a III-V group nitride system semiconductor self-standing substrate that is suitable for the epitaxial growth of a III-V group nitride system semiconductor layer with good flatness, uniformity and reproducibility.

It is a further object of the invention to provide a method of making the III-V group nitride system semiconductor self-standing substrate with good reproducibility.

It is a further object of the invention to provide a III-V group nitride system semiconductor wafer that a III-V group nitride system semiconductor layer is homo-epitaxially grown on the self-standing substrate with good flatness, uniformity and reproducibility.

According to the first aspect of the invention, a III-V group nitride system semiconductor self-standing substrate comprises:

III-V group nitride system semiconductor single crystal with a hexagonal crystal system crystalline structure, wherein the substrate is provided with a polished surface at every position of which crystal orientation perpendicular to the substrate surface is inclined 0.09 degrees or more from the C-axis direction of the substrate.

According to the second aspect of the invention, a III-V group nitride system semiconductor self-standing substrate comprises:

III-V group nitride system semiconductor single crystal with a hexagonal crystal system crystalline structure, wherein the substrate is provided with a polished surface at every position of which crystal orientation perpendicular to the substrate surface is inclined 0.09 degrees or more from the C-axis direction of the substrate, and dispersion in the inclination from the C-axis direction is within ±1 degree.

It is desirable that the crystal orientation is inclined 0.2 degrees or more from the C-axis direction of the substrate, and the dispersion in the inclination from the C-axis direction is within ±0.5 degrees.

The III-V group nitride system semiconductor single crystal self-standing substrate may be a gallium nitride single crystal substrate. The crystal orientation may be inclined in the a-axis direction of the substrate.

It is desirable that the inclination of crystal orientation has an in-plane dispersion of within ±1 degree and the minimum inclination is 0.09 degrees or more and the maximum inclination is 24 degrees or less.

It is further desirable that the inclination of crystal orientation has an in-plane dispersion of within ±0.5 degrees and the minimum inclination is 0.2 degrees or more and the maximum inclination is 20 degrees or less.

According to the third aspect of the invention, a method of making a III-V group nitride system semiconductor self-standing substrate comprises the steps of:

providing an underlying substrate with a surface inclined θ degrees in a specific direction from a low index surface of the underlying substrate;

growing a thick film of III-V group nitride system semiconductor single crystal on the underlying substrate; and separating the grown thick film from the underlying substrate to have the III-V group nitride system semiconductor self-standing substrate, wherein the thick film growing step is conducted to satisfy the following expression:

$$\theta > \sin^{-1}(D/2R) + 0.09 \text{ [degrees]}$$

where D is a diameter of the self-standing substrate after the separating and R is a curvature in distortion on the backside of the self-standing substrate.

The underlying substrate may be a sapphire substrate that has a surface inclined in the m-axis direction from C-face of the sapphire substrate. The underlying substrate may be a sapphire substrate that has a surface inclined 0.07 degrees or more and 20 degrees or less, preferably 0.2 degrees or more and 16 degrees or less, in the m-axis direction from C-face of the sapphire substrate.

The III-V group nitride system semiconductor single crystal self-standing substrate may be a gallium nitride single crystal substrate.

The III-V group nitride system semiconductor single crystal self-standing substrate may be a C-face gallium nitride single crystal substrate with an off-orientation, and the off-orientation is made in the a-axis direction. The off-orientation may be inclined 0.09 degrees or more and 24 degrees or less in the a-axis direction.

It is desirable that the off-orientation has an in-plane dispersion of within ±1 degree and the minimum off-orientation is 0.09 degrees or more and the maximum off-orientation is 24 degrees or less.

It is further desirable that the off-orientation has an in-plane dispersion of within ±0.5 degrees and the minimum off-orientation is 0.2 degrees or more and the maximum off-orientation is 20 degrees or less.

According to the fourth aspect of the invention, a method of making a III-V group nitride system semiconductor self-standing substrate comprises the steps of:

growing a first single crystal gallium nitride film on a sapphire C-face substrate with a surface inclined θ degrees in a specific direction;

depositing a metal film on the first gallium nitride film;

thermally treating the sapphire C-face substrate with the metal film deposited thereon in an atmosphere containing hydrogen gas or hydride gas to have the first gallium nitride film with a void formed therein;

growing a second single crystal gallium nitride film on the first gallium nitride film; and separating the second gallium nitride film from the first gallium nitride film and the sapphire substrate to have the III-V group nitride system semiconductor self-standing substrate, wherein the depositing step of the second gallium nitride film is conducted to satisfy the following expression:

$$\theta > \sin^{-1}(D/2R) + 0.09 \text{ [degrees]}$$

where D is a diameter of the self-standing substrate after the separating and R is a curvature in distortion on the backside of the self-standing substrate.

According to the fifth aspect of the invention, a method of making a III-V group nitride system semiconductor self-standing substrate comprises the steps of:

growing a thick film of III-V group nitride system semiconductor single crystal on an underling substrate with an off-orientation of θ degrees; and separating the grown thick film of III-V group nitride system semiconductor single crystal from the underlying substrate to have the III-V group nitride system semiconductor self-standing substrate with a surface inclined α degrees with a dispersion of ±β degrees from a low index surface in a specific direction, wherein the growing step of the thick film of III-V group nitride system semiconductor single crystal is conducted to satisfy the following expression:

$$\alpha\pm\beta=n\cdot\theta\pm\sin^{-1}(D/2R) \text{ [degrees]}$$

where D is a diameter of the self-standing substrate after the separating, R is a curvature in distortion on the backside of the self-standing substrate, and n is a constant.

According to the sixth aspect of the invention, a method of making a III-V group nitride system semiconductor self-standing substrate comprises the steps of:

growing a first single crystal gallium nitride film on a sapphire C-face substrate with a surface inclined θ degrees in a specific direction;

depositing a metal film on the first gallium nitride film;

thermally treating the sapphire C-face substrate with the metal film deposited thereon in an atmosphere containing hydrogen gas or hydride gas to have the first gallium nitride film with a void formed therein;

growing a second single crystal gallium nitride film on the first gallium nitride film; and separating the second gallium nitride film from the first gallium nitride film and the sapphire substrate to have the III-V group nitride system semiconductor self-standing substrate with a surface inclined α degrees with a dispersion of ±β degrees from a low index surface in a specific direction, wherein the depositing step of the second gallium nitride film is conducted to satisfy the following expression:

$$\alpha\pm\beta=n\cdot\theta\pm\sin^{-1}(D/2R) \text{ [degrees]}$$

where D is a diameter of the self-standing substrate after the separating, R is a curvature in distortion on the backside of the self-standing substrate, and n is a constant.

According to the seventh aspect of the invention, a III-V group nitride system semiconductor wafer comprises:

a III-V group nitride system semiconductor self-standing substrate that comprises III-V group nitride system semiconductor single crystal with a hexagonal crystal system crystalline structure, wherein the substrate is provided with a polished surface at every position of which crystal orientation perpendicular to the substrate surface is inclined 0.09 degrees or more from the C-axis direction of the substrate, and dispersion in the inclination from the C-axis direction is within ±1 degree, and a III-V group nitride system semiconductor layer that is homo-epitaxially grown on the self-standing substrate.

It is desirable that the crystal orientation is inclined 0.2 degrees or more from the C-axis direction of the substrate, and the dispersion in the inclination from the C-axis direction is within ±0.5 degrees.

Advantages of the Invention

By virtue of the invention, a III-V group nitride system semiconductor layer with good flatness, uniformity and reproducibility can be homo-epitaxially grown on the III-V group nitride system semiconductor self-standing substrate.

Further, by virtue of the method of making the III-V group nitride system semiconductor self-standing substrate in the invention, a III-V group nitride system semiconductor self-standing substrate with a suitable off-orientation can be made with a good responsibility in such a simple process as the conventional substrate manufacturing process.

Further, by virtue of the invention, the III-V group nitride system semiconductor wafer can be provided with an epitaxial growth layer with good flatness, uniformity and reproducibility. Therefore, the production yield can be enhanced in both epitaxial growth process and device fabrication process. In addition, a light emitting device or electronic device that has properties according to the designing can be fabricated.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1A:
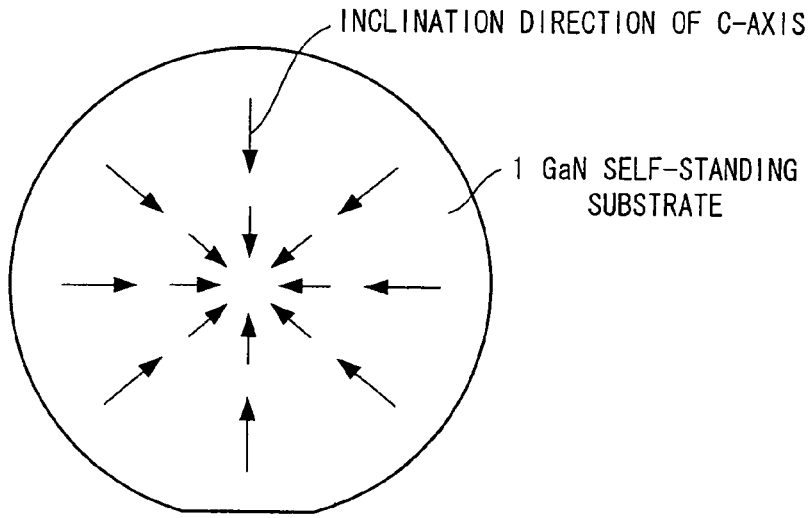
FIG. 1A is a plain view showing a GaN self-standing substrate having in-plane inclinations of C-axis generated due to a convex distortion on the back side thereof.

The invention is made in consideration of the abovementioned unique problems on nitride system semiconductor self-standing substrate and is based on the premise that there exists a dispersion in off-orientation in the plane of substrate. Hence, the invention is intended to provide a nitride system semiconductor self-standing substrate that, when epitaxially growing nitride system crystalline layer on the substrate, prevents a surface roughness such as hillock or terrace to cause problems in the fabrication of a device.

<1> Inclination of Crystal Axis of Self-standing Substrate

At first, the inventor measures the amount of crystal-axis inclination in a specific region in the plane of a substrate so as to research a relation between the surface morphology of epitaxial layer grown on the substrate and the amount of crystal-axis inclination. As a result, when the amount of crystal-axis inclination is less than 0.09 degrees, it is observed that a number of hexagonal microscopic uneven patterns with a size of about 50 to 200 μm are generated and the surface morphology of epitaxial layer deteriorates significantly. Therefore, it is needed that neither C-face itself nor any face inclined less than 0.09 degrees from the C-face exists on the substrate surface.

The symptom of microscopic uneven pattern generation begins when the off-orientation of III-V group nitride system semiconductor self-standing substrate is less than 0.2 degrees. Therefore, it is more desirable that the III-V group nitride system semiconductor self-standing substrate has an off-orientation of 0.2 degrees or more.

The dispersion of crystal-axis inclination is desirably within ±1 degree. This is because, if the dispersion of crystal-axis inclination is not within ±1 degree, a slightly inclined face is likely to be generated on the epitaxial surface. The slightly inclined face generated on the epitaxial surface causes a dispersion in composition in the growth of mixed crystal and, therefore, it becomes difficult to grow an epi-layer with a uniform in-plane composition.

The crystal-axis inclination direction is desirably along the cleavage direction of crystal, i.e., the a-axis direction. This is because the cleavage face is kept perfectly parallel in cleaving a device chip. Although the cleavage direction of GaN crystal is typically in the a-axis direction, the GaN crystal can be cleaved in the m-axis direction where it has a weak cleavage property. Therefore, the crystal-axis inclination direction may be along the m-axis direction.

It is desirable that the III-V group nitride system semiconductor self-standing substrate, especially GaN self-standing substrate has an off-orientation of 24 degrees or less. The reasons are as follows: First, if the off-orientation of sapphire substrate is too much, it becomes difficult to grow a thick GaN crystal film thereon. The inventor evaluates the crystalline quality of thick GaN crystal films that are grown on sapphire substrates with different off-orientations by HVPE. As a result, if the off-orientation of sapphire substrate exceeds 20 degrees, then the generation of crystal nuclei with an orientation not aligned is observed at part of grown crystal. This means that the single-crystal property of substrate is damaged. Thus, in order to grow GaN single crystal with a good crystalline quality on the sapphire substrate, the off-orientation of sapphire substrate is to be 20 degrees or less. The off-orientation of GaN self-standing substrate obtained by using a 20 degrees off-oriented sapphire substrate is 24 degrees at the maximum, though it depends on the growth conditions. Thus, in order to have a GaN self-standing substrate with a good crystalline quality, the off-orientation is desirably 24 degrees or less.

<2> Measurement Method of Crystal-axis Inclination

The inclination orientation of crystal axis in the plane of substrate can be measured by X-ray diffraction measurement. In detail, an X-ray diffraction peak is measured while rotating a crystal around an axis perpendicular to its diffraction surface. If the crystal axis is inclined, it is observed that the peak position is shifted. By finding which direction of crystal the diffraction peak is shifted maximally, the inclination direction of crystal axis can be determined. Further, by measuring the inclination of crystal axis at multiple points in the plane of substrate, the distribution of inclination can be easily determined.

<3> Relationship Between the Off-orientation of Underlying Substrate and the Diameter, Curvature of Self-standing Substrate The III-V group nitride system semiconductor self-standing substrate with such a crystal-axis inclination as described in <2> can be formed such that a thick film of III-V group nitride system single crystal is grown on a θ degrees off-oriented underlying substrate and then is separated from the underlying substrate.

In this case, provided that the diameter of self-standing substrate after the separation is D and the curvature of distortion on the back side of self-standing substrate is R, the thick film of III-V group nitride system single crystal is to be grown while satisfying the next condition expression:

$$\theta > \sin^{-1}(D/2R) + 0.09 \text{ [deg]} \quad (1)$$

The reasons are as follows:

The crystal-axis in a distorted self-standing substrate has a distribution in inclination according to the distorted form.

Figure 1B:
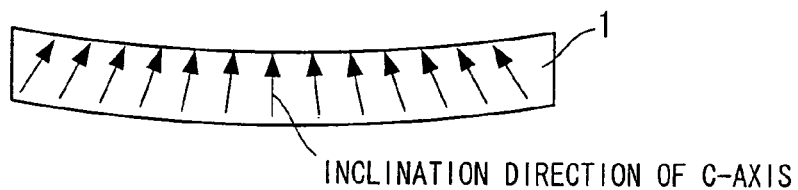
FIG. 1B is a side view showing the GaN self-standing substrate in FIG. 1A.
Figure 1C:
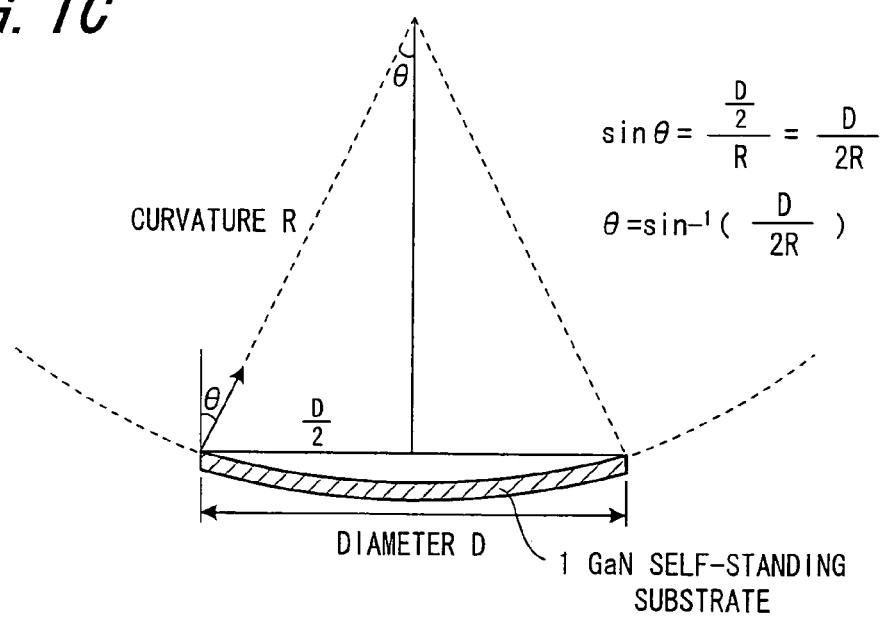
FIG. 1C illustrates the inclination of C-axis shown in FIG. 1A.

FIG. 1A is a plain view showing a GaN self-standing substrate having in-plane inclinations of C-axis generated due to a convex distortion on the back side thereof. FIG. 1B is a side view showing the GaN self-standing substrate in FIG. 1A. FIG. 1C illustrates the inclination of C-axis shown in FIG. 1A.

As shown in FIGS. 1A and 1B, the C-axis of GaN self-standing substrate 1 is distributed such that it is inclined toward the center of distortion curvature at every position in the plane of substrate and the amount of inclination increases according as getting away from the center of substrate. Provided that the GaN self-standing substrate 1 is distorted like a spherical surface, the diameter of self-standing substrate is D and the curvature of distortion on the back side of self-standing substrate 1 is R, a crystal-axis inclination of: $\sin^{-1}(D/2R)$ [deg] is generated at the outermost end of self-standing substrate 1, as shown in FIG. 1C. Thus, an in-plane dispersion, $\pm \sin^{-1}(D/2R)$ [deg], in crystal-axis inclination is necessarily generated in the plane of self-standing substrate 1. In order to allow a crystal orientation perpendicular to the substrate surface to be inclined greater than 0.09 degrees from the c-axis direction in the plane of substrate as described earlier, it is necessary to make a substrate that is inclined greater than 0.09 degrees in addition to the assumable maximum dispersion, in consideration of the distribution range. It is found that a GaN substrate grown using the above method can have an off-orientation equal to or greater than that of underlying substrate. Therefore, the crystal growth only has to be conducted such that the off-orientation θ degrees of underlying substrate satisfies the above condition expression (1).

According to the same reason, in the case of making a III-V group nitride system semiconductor substrate with a surface that is inclined a degrees with a dispersion of ±β degrees in a specific direction from a low index surface, the off-orientation θ of underlying substrate and the diameter D of self-standing substrate 1 is to be selected and the distortion curvature R on the back side of self-standing substrate 1 is to be optimized by the crystal growth conditions so as to satisfy the next condition expression:

$$\alpha \pm \beta = n \cdot \theta \pm \sin^{-1}(D/2R) \text{[deg]} \quad (2)$$

where n is a constant to be determined when a GaN substrate is grown with an off-orientation in proportion to an off-orientation of underlying substrate, and it is a value to be empirically determined according to the crystal growth conditions.

In consideration of the proportionality constant n, the expression (1) can be modified into:

$$\theta > (1/n)(\sin^{-1}(D/2R) + 0.09)\text{[deg]} \quad (3)$$

By using the expression (3), a more accurate value necessary for the off-orientation θ of underlying substrate can be calculated. However, since n is generally a value near to 1 and the off-orientation θ is normally determined considering a measurement error to be on the safe side, there is no problem using the expression (1).

<4> Method of Making the Self-standing Substrate

Figure 2:
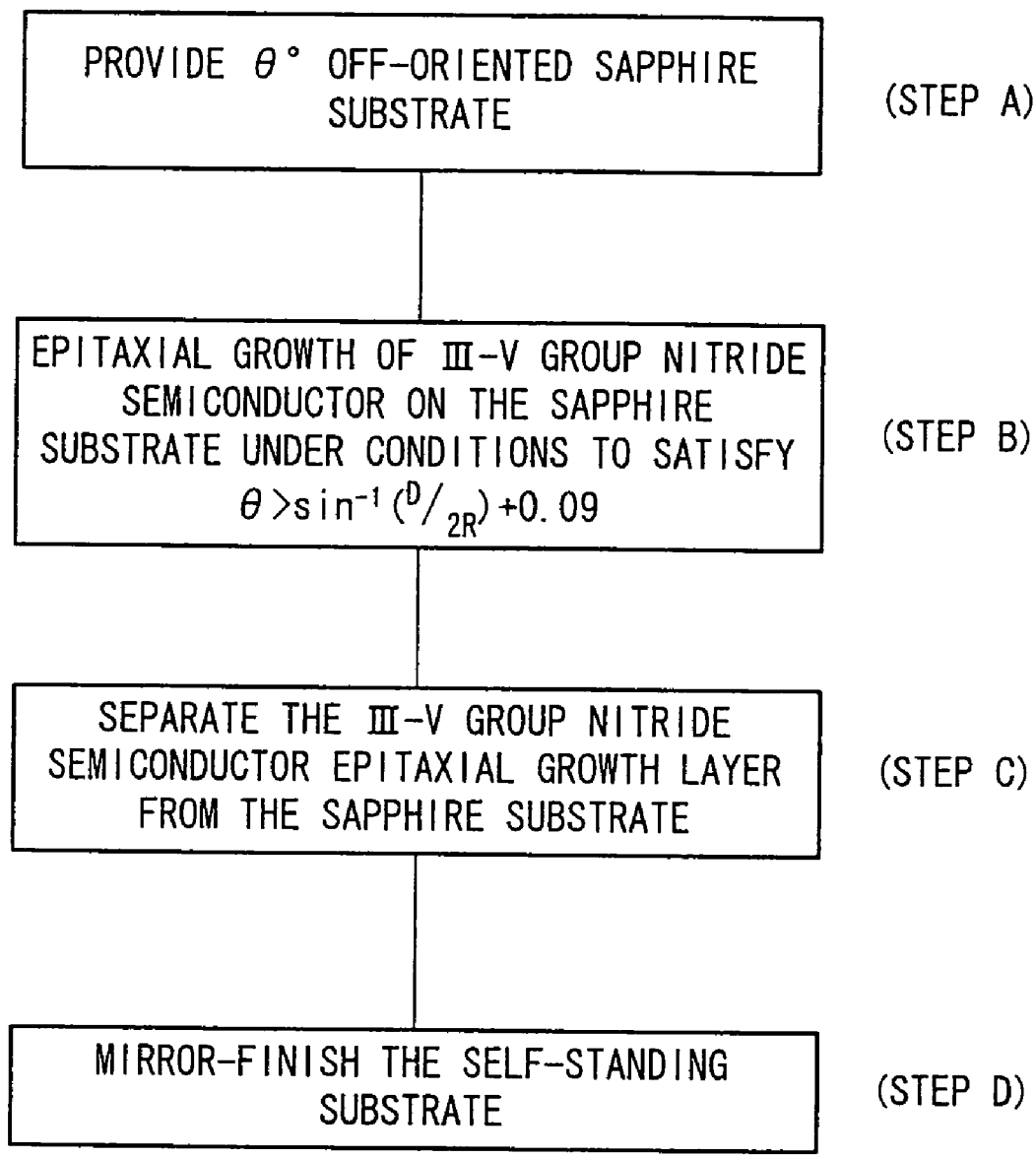
FIG. 2 is a flow chart explaining a process of making a III-V group nitride system semiconductor self-standing substrate in a preferred embodiment of the invention.

Referring to FIG. 2, a method of making the III-V group nitride system semiconductor self-standing substrate using a hetero-substrate in the embodiment of the invention will be explained below.

At first, a sapphire substrate with an off-orientation of θ degrees is provided as a hetero-substrate (step A). Sapphire substrates are preferably used as a hetero-substrate since they are stable in a high-temperature region of higher than 1000° C. for the growth temperature of GaN crystal and do not react with $H_2$, $NH_3$ and HCl that are source gas or atmospheric gas in crystal growth.

Then, the III-V group nitride system semiconductor is epitaxially grown on the sapphire substrate under the conditions to satisfy the next expression (step B).

$$\theta > \sin^{-1}(D/2R) + 0.09 \text{ [deg]} \quad (4)$$

The III-V group nitride system semiconductors available are represented by $In_xGa_yAl_{1-x-y}N$ ($0 \leq x \leq 1$, $0 \leq y \leq 1$, $0 \leq x+y \leq 1$). Of these, GaN and AlGaN are preferably used. This is because they satisfy properties required to a substrate material such as strength and stability in manufacture.

The growth of III-V group nitride system semiconductor is desirably conducted using MOVPE (metal organic vapor phase epitaxy), MBE (molecular beam epitaxy) and HVPE (hydride vapor phase epitaxy). Especially, in making a self-standing substrate by separating the epitaxial growth layer from the hetero-substrate after the crystal growth, it is preferable to use the HVPE method with a high crystal growth rate.

Then, the III-V group nitride system semiconductor epitaxial growth layer thus grown is separated from the sapphire substrate (Step C). The separation of sapphire substrate may be conducted by VAS or etching. Of these, the VAS method is desirably used. In the VAS method, the amount of distortion generated in grown GaN substrate is relatively small and, therefore, a substrate with a small off-orientation can be made. Further, reproducibility in the amount of distortion generated is high and, therefore, reproducibility in off-orientation of GaN substrate produced or in the amount of dispersion thereof can be enhanced.

Finally, the surface of GaN self-standing substrate is mirror-finished by polishing (step D). In general, the as-grown surface of GaN system epi-layer has large uneven patterns such as hillock or a number of microscopic uneven patterns assumed to be generated due to the step bunching. These may cause a deterioration in morphology of epitaxial layer grown thereon or a nonuniformity in film thickness or composition, and moreover, in the device fabrication process, may cause a reduction in exposure accuracy of photolithography. Therefore, it is desirable that the surface of self-standing substrate is provided with a flat mirror surface.

Further, it is desirable that the back surface of GaN system self-standing substrate is also flattened by polishing as well as the upper surface. In general, some GaN system self-standing substrates are obtained by separating it from an underlying hetero-substrate by some method after being hetero-epitaxially grown on the underlying hetero-substrate. Therefore, the back surface of the separated substrate is frequently roughened like a frosted glass or has part of underlying substrate attached thereto. Further, it is frequently not flat due to a distortion of substrate. If the substrate has a distortion (warp), the back face of substrate may not be in contact with a susceptor when conducting the epitaxial growth of device structure on the substrate. In such a case, heat conduction to the substrate will be not uniform and, thereby, a temperature distribution will be generated in the plane of substrate. Due to the in-plane temperature distribution, during the epitaxial growth, dispersion in grown film thickness, composition, impurity concentration etc. will occur. Thus, since it is impossible to offer the in-plane uniform growth, dispersion in device characteristics will be thereby increased. From the above reasons, it is desirable that both surfaces of the GaN system self-standing substrate are mirror-finished by polishing.

Thus, the self-standing III-V group nitride system semiconductor substrate (GaN self-standing substrate) can be obtained.

Figure 3:
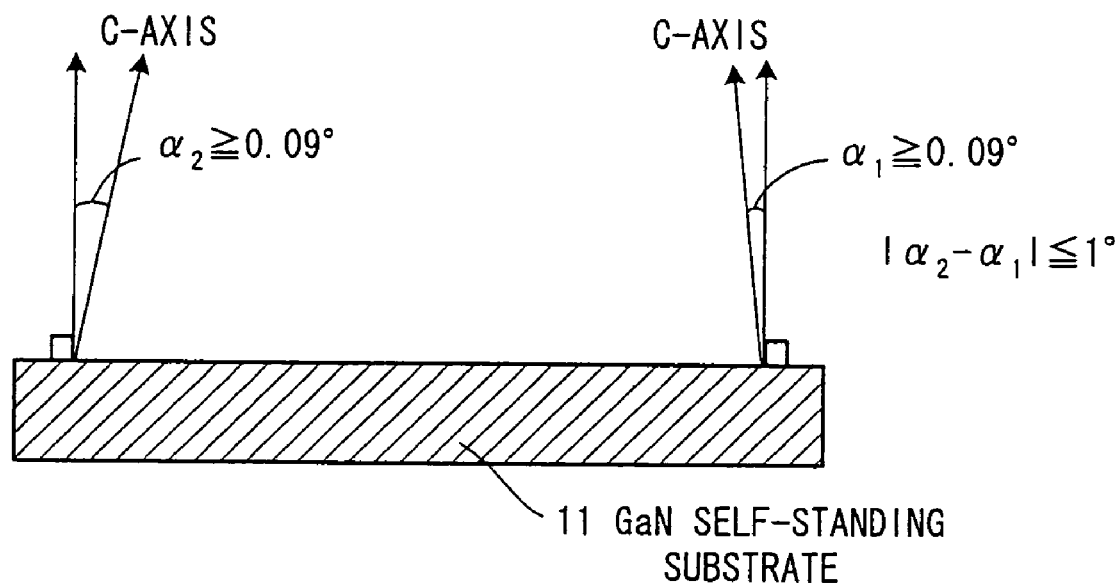
FIG. 3 is a cross sectional view showing a GaN self-standing substrate obtained in the embodiment.

FIG. 3 shows an example of GaN self-standing substrate thus obtained. In this GaN self-standing substrate 11, inclination angles α1, α2 from the C-axis direction of crystal axis at two arbitrary points in the plane of substrate are all greater than 0.09 degrees, and its dispersion |α2−α1| is suppressed within 1 degree.

Herein, a self-standing substrate means a substrate that can hold its shape by itself and has a sufficient strength for handling. In order to provide such a strength, the thickness of self-standing substrate needs to be preferably 200 μm or more. Also, in view of easiness in cleavage after the device fabrication, the thickness of self-standing substrate is preferably 1 mm or less. If it is greater than 1 mm, it becomes difficult to cleave the substrate and the cleavage surface is subjected to unevenness. As a result, if it is applied to a semiconductor laser etc., the device characteristics will deteriorate due to the reflection loss.

EXAMPLE 1

(Manufacture of GaN Self-standing Substrate by VAS)

Referring to FIGS. 4A to 4G, the manufacture of a GaN self-standing substrate by the VAS method will be explained below.

Figure 4A:
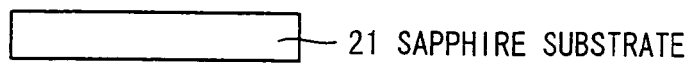
FIGS. 4A to 4G are schematic cross sectional views showing a process of making GaN self-standing substrates in Examples 1, 3 and 5.

At first, a commercially-available single-crystal sapphire C-face substrate 21 with a diameter of 2 inches is provided that is off-oriented 0.25 degrees in the m-axis direction (FIG. 4A).

Figure 4B:
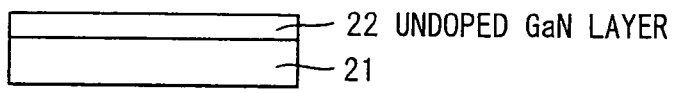
Figure 4C:
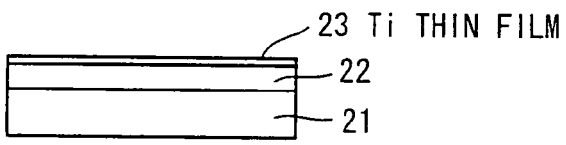
Figure 4D:
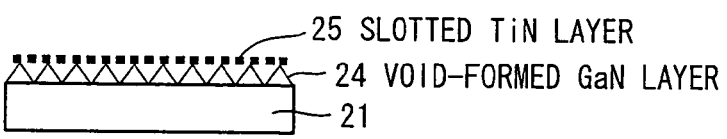

Then, a 300 nm undoped GaN layer 22 is grown on the sapphire substrate 21 by MOVPE using TMG, $NH_3$ as raw materials (FIG. 4B). Then, a 20 nm Ti film 23 is deposited on the GaN epi-substrate (FIG. 4C), entered into an electric oven, and heated at 1050° C. for 20 min in $H_2$ flow with 20% $NH_3$ mixed therein. Thereby, the Ti film 23 is processed into a mesh-like slotted TiN layer 25 and simultaneously the GaN layer 22 is processed into a void-formed GaN layer 24 (FIG. 4D).

Figure 4E:
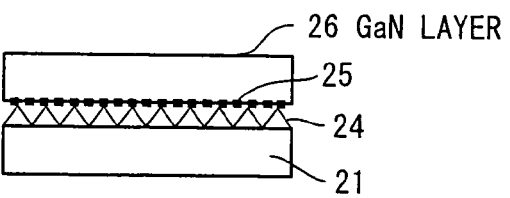
Figure 4F:
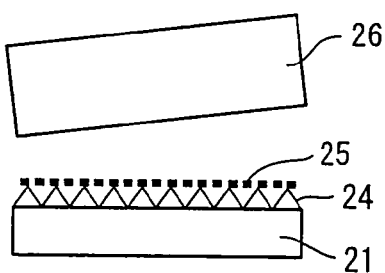
Figure 4G:
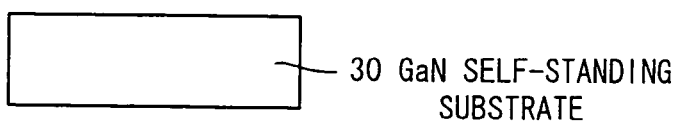

This is entered in an HVPE furnace, and then a 700 μm GaN layer 26 is deposited (FIG. 4E). $NH_3$ and GaCl are used raw materials and mixed gas of $N_2$ and $H_2$ is used as carrier gas. The growth conditions are atmospheric pressure and the substrate temperature is 1040° C. The HVPE crystal growth is about 120 μm/h. In the cooling process after the completion of growth, the GaN layer 26 is separated at the void-formed GaN layer 24 from the sapphire substrate (FIG. 4F). Thus, a GaN self-standing substrate 30 is obtained (FIG. 4G).

When, at step in FIG. 4B, the inclination distribution in crystal axis (C-axis) of the undoped GaN layer 22 is measured by X-ray diffraction measurement, it is confirmed that every inclination of C-axis measured at arbitrary point is inclined about 0.3 degrees in the a-axis direction of undoped GaN layer 22. Since the GaN crystal 26 grown through the TiN thin film 25 on the GaN layer 22 by HVPE is basically grown inheriting the inclination of crystal axis of underlying GaN layer 22, unless a distortion of substrate occurs, the GaN self-standing substrate 30 with C-axis off-oriented about 0.3 degrees in the a-axis direction will be obtained. Namely, in this growth condition, the proportionality constant n is determined about 1.2.

However, in fact, the GaN layer 26 grown by HVPE must be subjected to distortion when being separated from the sapphire substrate 21. In measuring the backside form of GaN self-standing substrate 30 separated from the sapphire substrate 21, its center side protrudes about 120 μm as compared to the outermost end. The diameter D of self-standing substrate 30 is about φ45 mm, which is slightly smaller than 42 inches, because the crystal growth does not proceed at the outermost end due to a clamp for the sapphire substrate 21. Thus, the curvature radius R is obtained about 2.1 m by being calculated from the diameter of GaN self-standing substrate 30 and a value to show the degree of convex distortion while approximating the backside form of GaN self-standing substrate 30 as a spherical surface. From this value, the inclination of C-axis is obtained about 0.6 degrees at the outermost end of GaN self-standing substrate 30 by using the expression $\sin^{-1}(D/2R)$. Viewing from this, it is assumed that the C-axis of self-standing substrate 30 has a resulting distribution of about −0.3 degrees to 0.9 degrees obtained by adding the in-plane dispersion of ±0.6 degrees to the abovementioned inclination of about 0.3 degrees in the a-axis direction.

Then, the upper and lower surfaces of GaN self-standing substrate 30 obtained are mirror-finished by polishing using diamond slurry.

Figure 5:
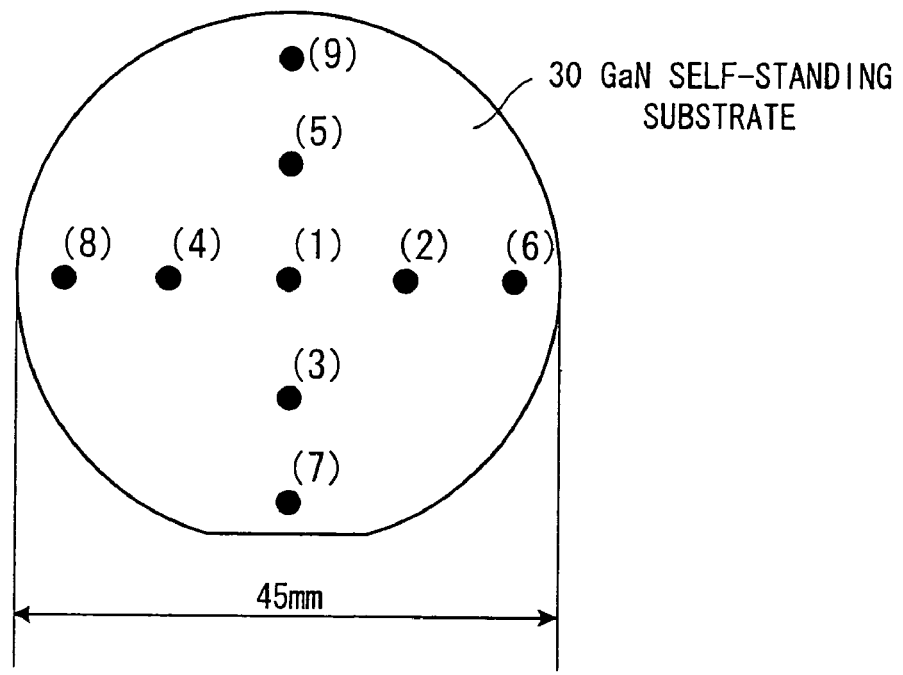
FIG. 5 is a plain view showing the measurement points of dispersion distribution in C-axis inclination of GaN self-standing substrates obtained in Examples 1 and 5.

The inclination distribution in C-axis of GaN self-standing substrate 30 thus manufactured is exactly measured at multiple points in the plane of substrate by X-ray diffraction measurement. The measurement points are nine as shown in FIG. 5. These points are indicated by numerals (1) to (9) in FIG. 5, and are located such that one is at the center and the others are 10 mm away from the center and from each other.

Figure 6:
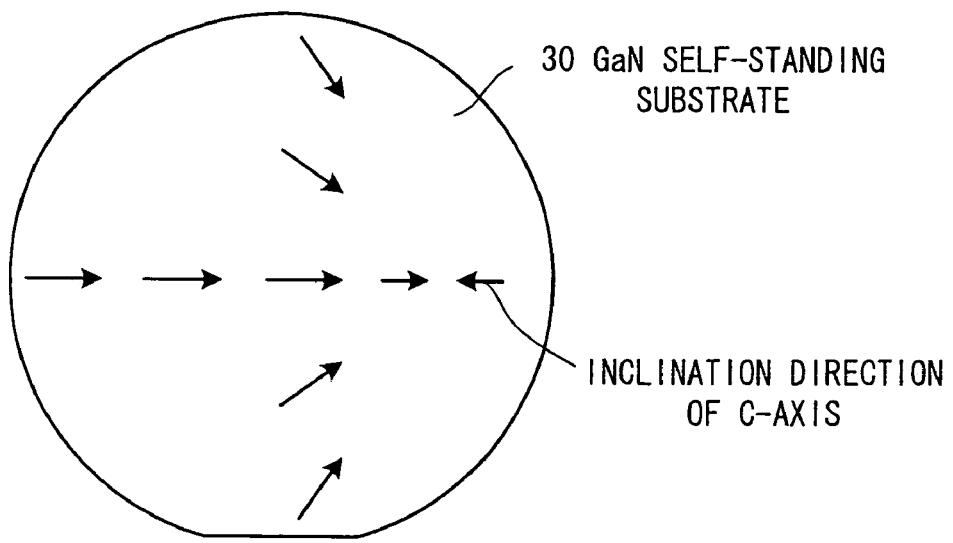
FIG. 6 is a plain view showing the inclination direction of C-axis at the distribution measurement points of GaN self-standing substrate obtained in Example 1.

Table 1 shows the measurement result. In Table 1, the amount of inclination means how much the C-axis of crystal is inclined to a perpendicular line at a measurement point on the substrate surface, and the inclination direction means how much the inclination vector of C-axis is rotated clockwise from a zero degree direction that is defined as the rightward direction of axis parallel to the orientation flat. The inclination vector of C-axis measured at each point is indicated by an arrow in FIG. 6.

amount of C-axis inclination is dispersed in the range of −0.26 to 0.84 degrees, provided that the vector direction in the a-axis direction is positive (+) to the right and negative (−) to the left in FIG. 6. This range is well in accordance with the dispersion range obtained by the calculation using the off-angle of underlying substrate and the form of crystal. The reason why the dispersion range measured is narrower than that calculated is estimated that the measurement point is not obtained at the outermost end.

EXAMPLE 2

(Formation of GaN Layer on GaN Self-standing Substrate)

Figure 7:
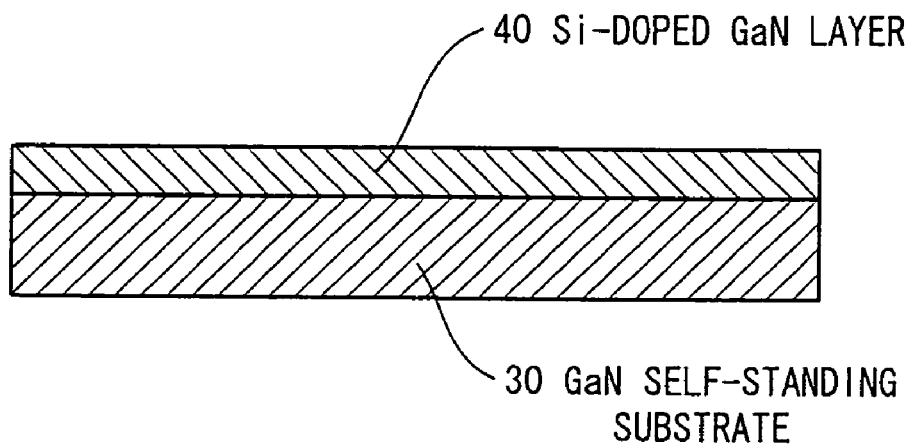
FIG. 7 is a cross sectional view showing a GaN self-standing substrate with a GaN layer formed thereon in Example 2.

As shown in FIG. 7, a 2 μm Si-doped GaN layer 40 is grown on the GaN self-standing substrate 30 manufactured in Example 1 by MOVPE. The growth pressure of GaN layer 40 is atmospheric pressure and the growth temperature of self-standing substrate 30 is 1100° C. TMG is used as III group raw material, $NH_3$ as V group material, and monosilane as dopant. The carrier gas is mixed gas of hydrogen and nitrogen. The growth rate of crystal is 4 μm/h, and target carrier concentration of epi-layer is $2\times10^{18}$ $cm^{-3}$.

Figure 8:
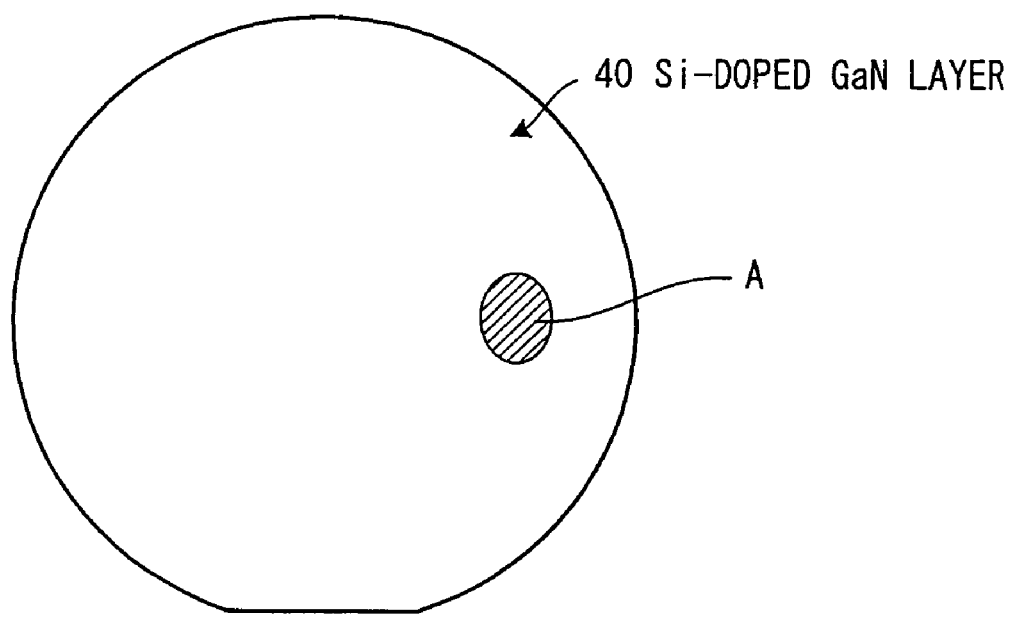
FIG. 8 is a plain view showing the surface morphology distribution of GaN layer in Example 2.

The surface of GaN layer 40 obtained is observed by Nomarski microscope. Although in most areas is observed a linear morphology that is assumed to be formed due to step bunching, only in a limited area is observed a region A that hexagonal uneven patterns of about 5 to 20 μm are collected. FIG. 8 shows the position of region A.

As the result of measuring the inclination of crystal C-axis inside and outside the region A with the collected hexagonal uneven patterns observed therein, it is confirmed that, regardless of the inclination direction of C-axis, inside the region A, the amount of C-axis inclination is always less than 0.09 degrees. In contrast, it is confirmed that, outside the region A, the amount of C-axis inclination is always more than 0.09 degrees.

EXAMPLE 3

(Manufacture of GaN Self-standing Substrate by VAS)

In analogy with Example 1, a GaN self-standing substrate is manufactured by the VAS method as shown in FIGS. 4A to 4G.

TABLE 1

Measurement results of GaN substrate C-axis inclination distribution in Example 1 unit: [degrees]

| Measurement point | (1) | (2) | (3) | (4) | (5) | (6) | (7) | (8) | (9) |
|---|---|---|---|---|---|---|---|---|---|
| Inclination amount | 0.39 | 0.15 | 0.59 | 0.55 | 0.57 | 0.26 | 0.77 | 0.84 | 0.79 |
| Inclination direction | 0.2 | 1.4 | 321.3 | 358.1 | 23.1 | 88.9 | 308.2 | 357.8 | 44.1 |

From the measurement results, it is confirmed that the amount (absolute value regardless of direction) of C-axis inclination of GaN self-standing substrate 30 is dispersed in the range of 0.15 to 0.84 degrees. Since the inclination direction at measurement point (6) is nearly opposite to that at measurement point (8) where the maximum inclination direction is obtained, it can be also interpreted that the At first, a commercially-available single-crystal sapphire C-face substrate 21 with a diameter of 2 inches is provided that is off-oriented 0.30 degrees in the m-axis direction (FIG. 4A).

Then, a 300 nm undoped GaN layer 22 is grown on the sapphire substrate 21 by MOVPE using TMG, $NH_3$ as raw materials (FIG. 4B). Then, a 20 nm Ti film 23 is deposited on the GaN epi-substrate (FIG. 4C), entered into an electric oven, and heated at 1050° C. for 20 min in $H_2$ flow with 20% $NH_3$ mixed therein. Thereby, the Ti film 23 is processed into a mesh-like slotted TiN layer 25 and simultaneously the GaN layer 22 is processed into a void-formed GaN layer 24 (FIG. 4D).

This is entered in an HVPE furnace, and then a 700 μm GaN layer 26 is deposited (FIG. 4E). $NH_3$ and GaCl are used raw materials and $N_2$ is used as carrier gas. The growth conditions are atmospheric pressure and the substrate temperature is 1040° C. The HVPE crystal growth is about 130 μm/h. In the cooling process after the completion of growth, the GaN layer 26 is separated at the void-formed GaN layer 24 from the sapphire substrate (FIG. 4F). Thus, a GaN self-standing substrate 30 is obtained (FIG. 4G).

When, at step in FIG. 4B, the inclination distribution in crystal axis (C-axis) of the undoped GaN layer 22 is measured by X-ray diffraction measurement, it is confirmed that every inclination of C-axis measured at arbitrary point is inclined about 0.35 degrees in the a-axis direction of undoped GaN layer 22. Since the GaN crystal 26 grown through the TiN thin film 25 on the GaN layer 22 by HVPE is basically grown inheriting the inclination of crystal axis of underlying GaN layer 22, unless a distortion of substrate occurs, the GaN self-standing substrate 30 with C-axis off-oriented about 0.35 degrees in the a-axis direction will be obtained. Namely, in this growth condition, the proportionality constant n is determined about 1.2.

However, in fact, the GaN layer 26 grown by HVPE must be subjected to distortion when being separated from the sapphire substrate 21. In measuring the backside form of GaN self-standing substrate 30 separated from the sapphire substrate 21, its center side protrudes about 250 μm as compared to the outermost end. The diameter D of self-standing substrate 30 is about φ45 mm, which is slightly smaller than φ2 inches, because the crystal growth does not proceed at the outermost end due to a clamp for the sapphire substrate 21. In analogy with Example 1, the C-axis inclination of self-standing substrate 30 is calculated about 1.3 degrees from the diameter of GaN self-standing substrate 30 and a value to show the degree of convex distortion. Viewing from this, it is assumed that the C-axis of self-standing substrate 30 has a resulting distribution of about −0.95 degrees to 1.65 degrees obtained by adding the in-plane dispersion of ±1.3 degrees to the abovementioned inclination of about 0.35 degrees in the a-axis direction.

Then, the upper and lower surfaces of GaN self-standing substrate 30 obtained are mirror-finished by polishing using diamond slurry. Then, it is measured by X-ray diffraction measurement how much the C-axis of crystal is inclined to a perpendicular line at a measurement point on the substrate surface. As a result, the inclination direction distribution in C-axis of self-standing substrate 30 is similar to that in Example 1. The amount of C-axis inclination is dispersed in the range of −0.84 (minimum) to 1.52 (maximum) degrees, provided that the vector direction in the a-axis direction is positive (+) to the right and negative (−) to the left in FIG. 6. This range is well in accordance with the dispersion range obtained by the calculation using the off-angle of underlying substrate and the form of crystal.

EXAMPLE 4

(Formation of GaN Layer on GaN Self-standing Substrate)

A 2 μm Si-doped GaN layer 50 is grown on the GaN self-standing substrate 30 manufactured in Example 3 by MOVPE. The growth pressure of GaN layer 50 is atmospheric pressure and the growth temperature of self-standing substrate 30 is 1100° C. TMG is used as III group raw material, $NH_3$ as V group material, and monosilane as dopant. The carrier gas is mixed gas of hydrogen and nitrogen. The growth rate of crystal is 4 μm/h, and target carrier concentration of epi-layer is $2 \times 10^{18}$ cm$^{-3}$.

Figure 9:
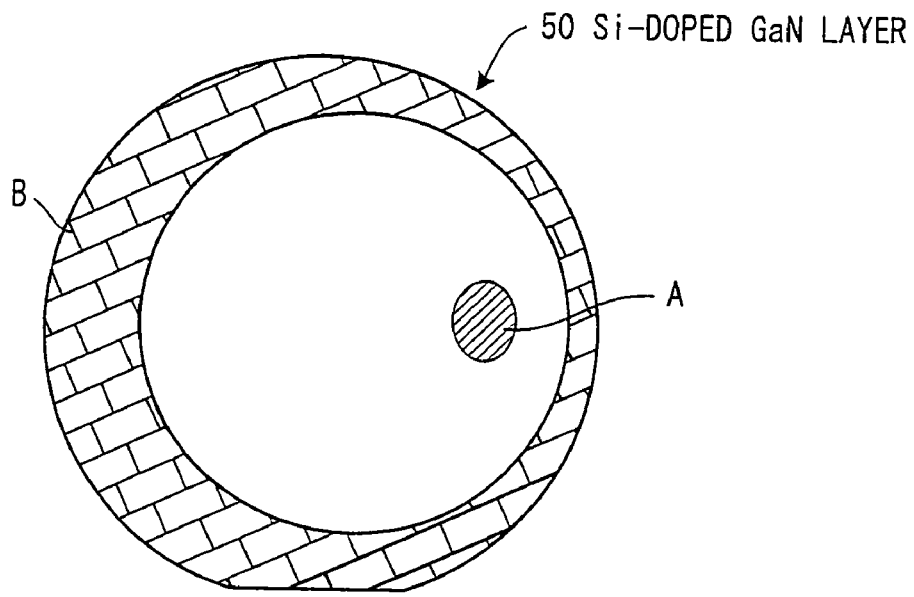
FIG. 9 is a plain view showing the surface morphology distribution of GaN layer in Example 4.

The surface of GaN layer 50 obtained is observed by Nomarski microscope. Although in most areas is observed a linear morphology that is assumed to be formed due to step bunching, only in a limited area is observed a region A that hexagonal uneven patterns of about 5 to 20 μm are collected. Also, at the periphery of substrate is observed a region B that the direction of linear morphology formed varies at intervals of several hundreds of μm. FIG. 9 shows the position relationship of region A and region B.

As the result of measuring the inclination of crystal C-axis inside and outside the region A with the collected hexagonal uneven patterns observed therein, it is confirmed that, regardless of the inclination direction of C-axis, inside the region A, the amount of C-axis inclination is always less than 0.09 degrees. In contrast, it is confirmed that, outside the region A, the amount of C-axis inclination is always more than 0.09 degrees.

Although the area of region B with the rough morphology observed on the periphery of substrate can be somewhat reduced by changing the epi-growth conditions in MOVPE, such as the growth temperature and the concentration of source gas, the region B cannot be removed. Such a tendency can be commonly observed in a substrate that has a dispersion in off-angle on the surface of substrate of beyond ±1 degree.

EXAMPLE 5

(Manufacture of GaN Self-standing Substrate by VAS)

In analogy with Example 1, a GaN self-standing substrate is manufactured by the VAS method as shown in FIGS. 4A to 4G.

At first, a commercially-available single-crystal sapphire C-face substrate 21 with a diameter of 2 inches is provided that is off-oriented 0.66 degrees in the m-axis direction (FIG. 4A).

Then, a 300 nm undoped GaN layer 22 is grown on the sapphire substrate 21 by MOVPE using TMG, $NH_3$ as raw materials (FIG. 4B). Then, a 20 nm Ti film 23 is deposited on the GaN epi-substrate (FIG. 4C), entered into an electric oven, and heated at 1050° C. for 20 min in $H_2$ flow with 20% $NH_3$ mixed therein. Thereby, the Ti film 23 is processed into a mesh-like slotted TiN layer 25 and simultaneously the GaN layer 22 is processed into a void-formed GaN layer 24 (FIG. 4D).

This is entered in an HVPE furnace, and then a 700 μm GaN layer 26 is deposited (FIG. 4E). $NH_3$ and GaCl are used raw materials and mixed gas of $N_2$ and $H_2$ is used as carrier gas. The growth conditions are atmospheric pressure and the substrate temperature is 1040° C. The HVPE crystal growth is about 120 μm/h. In the cooling process after the completion of growth, the GaN layer 26 is separated at the void-formed GaN layer 24 from the sapphire substrate (FIG. 4F). Thus, a GaN self-standing substrate 30 is obtained (FIG. 4G).

When, at step in FIG. 4B, the inclination distribution in crystal axis (C-axis) of the undoped GaN layer 22 is measured by X-ray diffraction measurement, it is confirmed that every inclination of C-axis measured at arbitrary point is inclined about 0.8 degrees in the a-axis direction of undoped GaN layer 22. Since the GaN crystal 26 grown through the TiN thin film 25 on the GaN layer 22 by HVPE is basically grown inheriting the inclination of crystal axis of underlying GaN layer 22, unless a distortion of substrate occurs, the GaN self-standing substrate 30 with C-axis off-oriented about 0.8 degrees in the a-axis direction will be obtained. Namely, in this growth condition, the proportionality constant n is determined about 1.2.

In measuring the backside form of GaN self-standing substrate 30 separated from the sapphire substrate 21, its center side protrudes about 110 μm as compared to the outermost end. The diameter D of self-standing substrate 30 is about ϕ45 mm. Thus, the curvature radius R is obtained about 2.3 m by being calculated from the diameter of GaN self-standing substrate 30 and a value to show the degree of convex distortion while approximating the backside form of GaN self-standing substrate 30 as a spherical surface. In analogy with Example 1, the C-axis inclination of self-standing substrate 30 is calculated about 0.6 degrees at the outermost end of GaN self-standing substrate 30. Viewing from this, it is assumed that the C-axis of self-standing substrate 30 has a resulting distribution of about +0.2 degrees to 1.4 degrees obtained by adding the in-plane dispersion of ±0.6 degrees to the abovementioned inclination of about 0.8 degrees in the a-axis direction.

Then, the upper and lower surfaces of GaN self-standing substrate 30 obtained are mirror-finished by polishing using diamond slurry.

The inclination distribution in C-axis of GaN self-standing substrate 30 thus manufactured is exactly measured at multiple points in the plane of substrate by X-ray diffraction measurement. The measurement points are nine as shown in FIG. 5, in analogy with Example 1.

Table 2 shows the measurement result. In Table 2, the amount of inclination means how much the C-axis of crystal is inclined to a perpendicular line at a measurement point on the substrate surface, and the inclination direction means how much the inclination vector of C-axis is rotated clockwise from a zero degree direction that is defined as the rightward direction of axis parallel to the orientation flat. The inclination vector of C-axis measured at each point is indicated by an arrow in FIG. 10.

Figure 10:
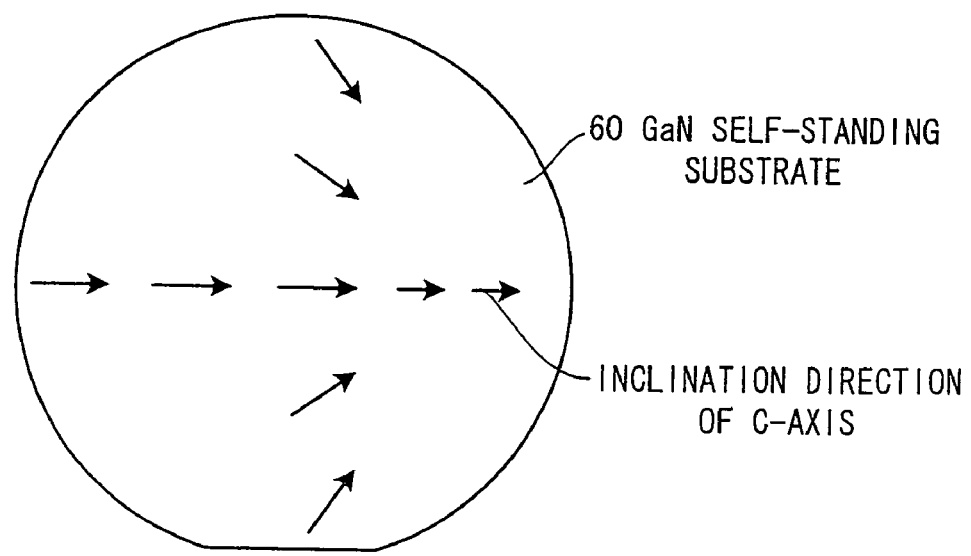
FIG. 10 is a plain view showing the inclination direction of C-axis at the distribution measurement points of GaN self-standing substrate obtained in Example 4.

As shown in FIG. 10, in Example 5, the inclination direction at measurement point (6), which is, in Example 1, opposite to that at other measurement points, is the same as that at other measurement points. Therefore, it can be readily assumed that there exists no point with a C-axis inclination of less than 0.09 degrees, even in other regions than the measurement points.

EXAMPLE 6

(Formation of GaN Layer on GaN Self-standing Substrate)

A 2 μm Si-doped GaN layer is grown on the GaN self-standing substrate 30 manufactured in Example 5 by MOVPE. The growth pressure of GaN layer is atmospheric pressure and the growth temperature of self-standing substrate 30 is 1100° C. TMG is used as III group raw material, $NH_3$ as V group material, and monosilane as dopant. The carrier gas is mixed gas of hydrogen and nitrogen. The growth rate of crystal is 4 μm/h, and target carrier concentration of epi-layer is $2 \times 10^{18}$ $cm^{-3}$.

The surface of GaN layer obtained is observed by Nomarski microscope. A uniform linear morphology is observed over all regions. Neither the region A observed in Examples 2 and 4 that hexagonal uneven patterns are collected nor the region B observed in Example 4 that the direction of linear morphology formed varies at intervals of several hundreds of μm is observed in Example 6.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, although in the above embodiments the sapphire substrate is used as the underlying substrate to fabricate the III-V group nitride system semiconductor substrate of the invention, all conventionally known substrates, such as GaAs, Si, $ZrB_2$ and ZnO, to be used as a GaN system epitaxial layer forming substrate can be applied thereto.

In the invention, it is desirable that the self-standing substrate is provided with a hexagonal system C-face, especially III-group face, on the surface because the III-group

TABLE 2

Measurement results of GaN substrate C-axis inclination distribution in Example 5 unit: [degrees]

| Measurement point | (1) | (2) | (3) | (4) | (5) | (6) | (7) | (8) | (9) |
|---|---|---|---|---|---|---|---|---|---|
| Inclination amount | 0.78 | 0.39 | 0.83 | 1.12 | 0.89 | 0.27 | 0.94 | 1.36 | 0.97 |
| Inclination direction | 0.3 | 0.4 | 341.3 | 359.4 | 17.1 | 0.5 | 328.1 | 0.2 | 27.6 |

From the measurement results, it is confirmed that the amount (absolute value regardless of direction) of C-axis inclination of GaN self-standing substrate 30 is dispersed in the range of 0.27 to 1.36 degrees. This range is well in accordance with the dispersion range obtained by the calculation using the off-angle of underlying substrate and the form of crystal.

Thus, the substrate is obtained that the C-axis inclination is greater than 0.09 degrees at all measurement points and the dispersion is within ±1 degree.

face is chemically, mechanically and thermally stable. However, it may be provided with A-face or R-face other than C-face and may be of cubic system crystal on the surface.

Although in the above embodiments the method of making a GaN self-standing substrate is exemplified, the invention can be applied to an AlGaN self-standing substrate.

Although in the above embodiments the VAS method for separating the substrate is exemplified, the various known methods cited in "DESCRIPTION OF THE RELATED ARTS" can be used in the invention.

Although in the above embodiments the manufacture of GaN substrate off-oriented in the a-axis direction is exemplified, the manufacture of GaN substrate off-oriented in the m-axis direction can be conducted as well, by using a sapphire substrate off-oriented in the a-axis direction.

Although in the above embodiments the polishing for mirror-finish is conducted such that the off-orientation of substrate is not changed, the off-angle can be somewhat controlled by the polishing the substrate obliquely.

What is claimed is:

1. A III-V group nitride system semiconductor self-standing substrate, comprising:
    III-V group nitride system semiconductor single crystal with a hexagonal crystal system crystalline structure, wherein the substrate is provided with a polished surface at every position of which crystal orientation perpendicular to the substrate surface is inclined 0.09 degrees or more from the C-axis direction of the substrate, and dispersion in the inclination from the C-axis direction is within ±1 degree.

2. The III-V group nitride system semiconductor self-standing substrate according to claim 1, wherein:
    the III-V group nitride system semiconductor single crystal self-standing substrate is a gallium nitride single crystal substrate.

3. The III-V group nitride system semiconductor self-standing substrate according to claim 1, wherein:
    the III-V group nitride system semiconductor single crystal self-standing substrate is a gallium nitride single crystal substrate, and the crystal orientation is inclined in the a-axis direction of the substrate.

4. The III-V group nitride system semiconductor self-standing substrate according to claim 1, wherein:
    the inclination of crystal orientation has an in-plane dispersion of within ±1 degree and the minimum inclination is 0.09 degrees or more and the maximum inclination is 24 degrees or less.

5. A III-V group nitride system semiconductor wafer, comprising:
    a III-V group nitride system semiconductor self-standing substrate that comprises III-V group nitride system semiconductor single crystal with a hexagonal crystal system crystalline structure, wherein the substrate is provided with a polished surface at every position of which crystal orientation perpendicular to the substrate surface is inclined 0.09 degrees or more from the C-axis direction of the substrate, and dispersion in the inclination from the C-axis direction is within ±1 degree, and
    a III-V group nitride system semiconductor layer that is homo-epitaxially grown on the self-standing substrate.

6. A method of making a III-V group nitride system semiconductor self-standing substrate, comprising:
    providing an underlying substrate with a surface inclined θ degrees in a specific direction from a low index surface of the underlying substrate;
    growing a thick film of III-V group nitride system semiconductor single crystal on the underlying substrate; and
    separating the grown thick film from the underlying substrate to have the III-V group nitride system semiconductor self-standing substrate,
    wherein the thick film growing is conducted to satisfy the following expression:

θ>sin−1(D/2R)+0.09 [degrees]

where D is a diameter of the self-standing substrate after the separating and R is a curvature in distortion on the backside of the self-standing substrate.

7. The method according to claim 6, wherein:
    the underlying substrate is a sapphire substrate that has a surface inclined in the m-axis direction from C-face of the sapphire substrate.

8. The method according to claim 6, wherein:
    the underlying substrate is a sapphire substrate that has a surface inclined 0.07 degrees or more and 20 degrees or less in the in-axis direction from C-face of the sapphire substrate.

9. The method according to claim 6, wherein:
    the III-V group nitride system semiconductor single crystal self-standing substrate is a gallium nitride single crystal substrate.

10. The method according to claim 6, wherein:
    the III-V group nitride system semiconductor single crystal self-standing substrate is a C-face gallium nitride single crystal substrate with an off-orientation, and the off-orientation is made in the a-axis direction.

11. The method according to claim 6, wherein:
    the III-V group nitride system semiconductor single crystal self-standing substrate is a C-face gallium nitride single crystal substrate with an off-orientation, and the off-orientation is 0.09 degrees or more and 24 degrees or less in the a-axis direction.

12. The method according to claim 11, wherein:
    the off-orientation has an in-plane dispersion of within ±1 degree and the minimum off-orientation is 0.09 degrees or more and the maximum off-orientation is 24 degrees or less.

13. A method of making a III-V group nitride system semiconductor self-standing substrate, comprising:
    growing a first single crystal gallium nitride film on a sapphire C-face substrate with a surface inclined θ degrees in a specific direction;
    depositing a metal film on the first gallium nitride film;
    thermally treating the sapphire C-face substrate with the metal film deposited thereon in an atmosphere containing hydrogen gas or hydride gas to have the first gallium nitride film with a void formed therein;
    growing a second single crystal gallium nitride film on the first gallium nitride film; and
    separating the second gallium nitride film from the first gallium nitride film and the sapphire substrate to have the III-V group nitride system semiconductor self-standing substrate,
    wherein the depositing of the second gallium nitride film is conducted to satisfy the following expression:

θ>sin−1(D/2R)+0.09[degrees]

where D is a diameter of the self-standing substrate after the separating and R is a curvature in distortion on the backside of the self-standing substrate.

14. A method of making a III-V group nitride system semiconductor self-standing substrate, comprising:
    growing a thick film of III-V group nitride system semiconductor single crystal on an underling substrate with an off-orientation of θ degrees; and
    separating the grown thick film of III-V group nitride system semiconductor single crystal from the underlying substrate to have the III-V group nitride system semiconductor self-standing substrate with a surface inclined a degrees with a dispersion of ±β degrees from a low index surface in a specific direction, wherein the growing step of the thick film of III-V group nitride system semiconductor single crystal is conducted to satisfy the following expression:

$$\alpha \pm \beta = n \cdot \theta \pm \sin^{-1}(D/2R)\,[\text{degrees}]$$

where D is a diameter of the self-standing substrate after the separating, R is a curvature in distortion on the backside of the self-standing substrate, and n is a constant.

15. A method of making a III-V group nitride system semiconductor self-standing substrate, comprising:
  growing a first single crystal gallium nitride film on a sapphire C-face substrate with a surface inclined θ degrees in a specific direction;
  depositing a metal film on the first gallium nitride film;
  thermally treating the sapphire C-face substrate with the metal film deposited thereon in an atmosphere containing hydrogen gas or hydride gas to have the first gallium nitride film with a void formed therein;
  growing a second single crystal gallium nitride film on the first gallium nitride film; and
  separating the second gallium nitride film from the first gallium nitride film and the sapphire substrate to have the III-V group nitride system semiconductor self-standing substrate with a surface inclined α degrees with a dispersion of ±β degrees from a low index surface in a specific direction,
  wherein the depositing of the second gallium nitride film is conducted to satisfy the following expression:

$$\alpha \pm \beta = n \cdot \theta \pm \sin^{-1}(D/2R)\,[\text{degrees}]$$

where D is a diameter of the self-standing substrate after the separating, R is a curvature in distortion on the backside of the self-standing substrate, and n is a constant.

* * * * *